United States Patent
Patra

(10) Patent No.: US 10,126,658 B2
(45) Date of Patent: Nov. 13, 2018

(54) ILLUMINATION OPTICAL UNIT FOR EUV PROJECTION LITHOGRAPHY

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 438 days.

(21) Appl. No.: 14/517,139

(22) Filed: Oct. 17, 2014

(65) Prior Publication Data

US 2015/0036115 A1 Feb. 5, 2015

Related U.S. Application Data

(63) Continuation of application No. PCT/EP2013/059016, filed on Apr. 30, 2013.

(Continued)

(30) Foreign Application Priority Data

May 15, 2012 (DE) ........................ 10 2012 208 064

(51) Int. Cl.
 *G03B 27/54* (2006.01)
 *G03F 7/20* (2006.01)
 (Continued)

(52) U.S. Cl.
 CPC ........ *G03F 7/70116* (2013.01); *G02B 5/0891* (2013.01); *G02B 26/0833* (2013.01);
 (Continued)

(58) Field of Classification Search
 CPC .......... G02B 26/0833–26/0858; G02B 5/0891; G03F 7/70075; G03F 7/70083;
 (Continued)

(56) References Cited

U.S. PATENT DOCUMENTS 6,438,199 B1 8/2002 Schultz et al.
6,658,084 B2 12/2003 Singer
(Continued)

FOREIGN PATENT DOCUMENTS

DE 10 2008 009 600 A1 8/2009
EP 1 225 481 A2 7/2002
(Continued)

OTHER PUBLICATIONS

International Search Report for corresponding PCT Appln No. PCT/EP2013/059016, dated Sep. 10, 2013.

(Continued)

*Primary Examiner* — Christina Riddle
(74) *Attorney, Agent, or Firm* — Fish & Richardson P.C.

(57) ABSTRACT

Illumination optical unit for EUV projection lithography guides illumination light to an object field. The illumination optical unit has a first facet mirror, which comprises a multiplicity of individual mirrors which can be switched between at least two tilt positions. A second facet mirror of the illumination optical unit is arranged downstream of the first facet mirror in the beam path of the illumination light. The second facet mirror has a plurality of facets, which respectively contribute to imaging a group of the individual mirrors of the first facet mirror into the object field via a group mirror illumination channel. The images of the groups are superposed on one another in the object field. At least some of the individual mirrors belong to at least two different groups of the individual mirror groups, which are respectively associated with a dedicated second facet via a dedicated group mirror illumination channel.

18 Claims, 5 Drawing Sheets

Related U.S. Application Data

Figure 1:
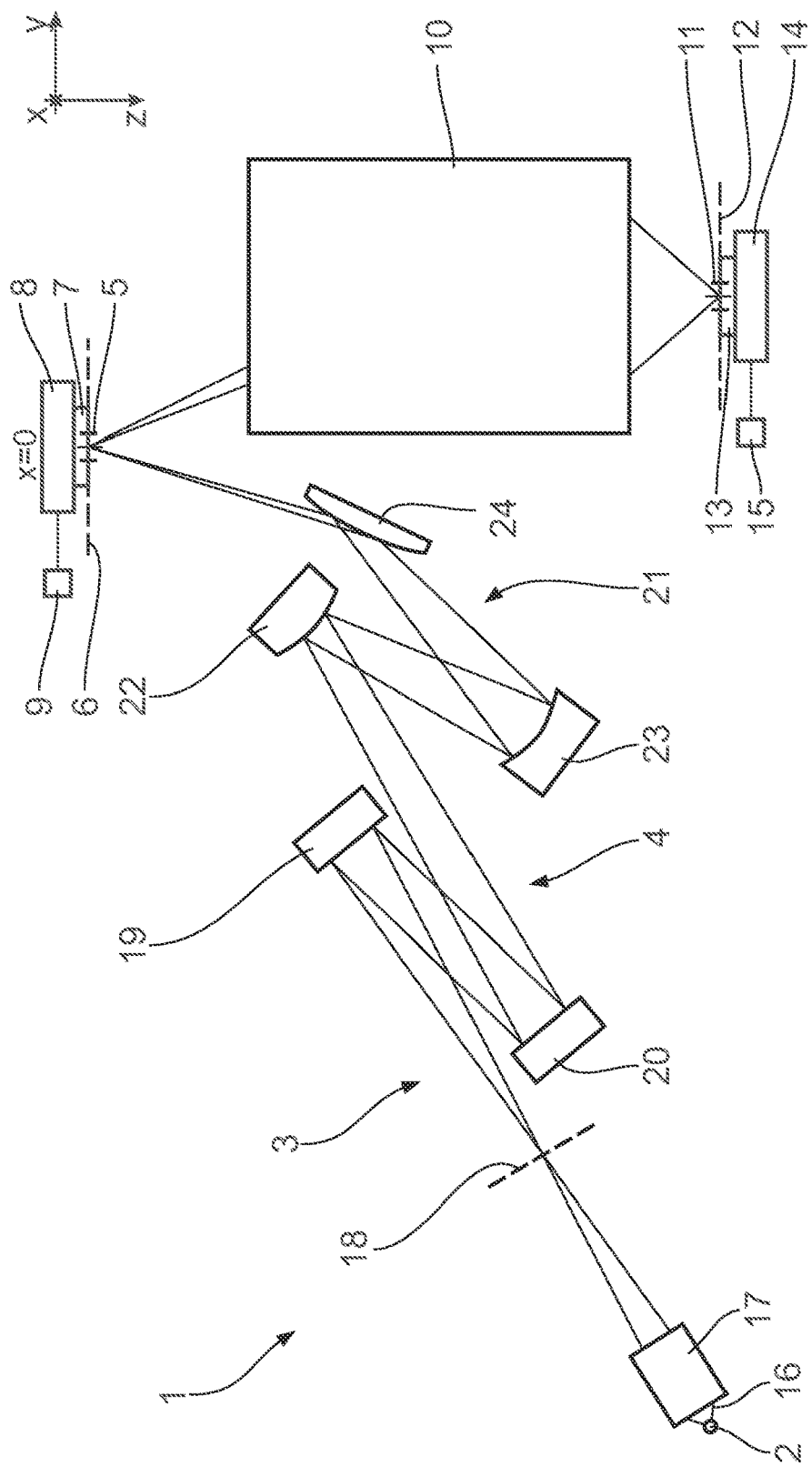

(60) Provisional application No. 61/646,965, filed on May 15, 2012.

(51) Int. Cl.
  *G02B 26/08* (2006.01)
  *G02B 5/08* (2006.01)

(52) U.S. Cl.
  CPC .......... *G03F 7/702* (2013.01); *G03F 7/70075* (2013.01); *G03F 7/70083* (2013.01)

(58) Field of Classification Search
  CPC ............. G03F 7/70091; G03F 7/70108; G03F 7/70116; G03F 7/70125; G03F 7/702; G03F 7/70208
  USPC ..................... 355/30, 52, 53, 55, 67–71, 77; 250/492.1, 492.2, 492.22, 492.23, 493.1, 250/505.1; 359/850, 857, 862, 865, 359/872–877
  See application file for complete search history.

(56) References Cited

U.S. PATENT DOCUMENTS

| | | |
|---|---|---|
| 6,859,515 B2 | 2/2005 | Schultz et al. |
| 8,817,233 B2 | 8/2014 | Mann |
| 2003/0227603 A1* | 12/2003 | Dierichs ............. G03F 7/70091 355/47 |
| 2007/0273859 A1 | 11/2007 | Komatsuda |
| 2008/0013680 A1 | 1/2008 | Singer et al. |
| 2009/0041182 A1* | 2/2009 | Endres ................ G03F 7/70075 378/34 |
| 2011/0001947 A1 | 1/2011 | Dinger et al. |
| 2014/0218709 A1 | 8/2014 | Staicu et al. |
| 2015/0002925 A1 | 1/2015 | Endres et al. |
| 2016/0313646 A1 | 10/2016 | Dinger et al. |

FOREIGN PATENT DOCUMENTS

| | | |
|---|---|---|
| JP | 2009-535827 A | 10/2009 |
| JP | 2011-512659 A | 4/2011 |
| JP | 2011-228698 A | 11/2011 |
| JP | 2012-504321 A | 2/2012 |
| WO | WO 2009/100 856 A1 | 8/2009 |
| WO | WO 2010/149487 | 12/2010 |

OTHER PUBLICATIONS

German Office Action, with translation thereof, for corresponding DE Appl No. 10 2012 208 064.3, dated Dec. 21, 2012.

Japanese office action, with English translation, for corresponding JP Appl No. 2015-511982, dated Jan. 20, 2017.

Japanese Office Action, with translation thereof, for corresponding Appl No. JP 2015-511982, dated Sep. 6, 2017.

* cited by examiner

ILLUMINATION OPTICAL UNIT FOR EUV PROJECTION LITHOGRAPHY

CROSS-REFERENCE TO RELATED APPLICATIONS

The present application is a continuation of, and claims benefit under 35 USC 120 to, international application PCT/EP2013/059016, filed Apr. 30, 2013, which claims benefit under 35 USC 119 of German Application No. 10 2012 208 064.3, filed May 15, 2012. International application PCT/EP2013/059016 also claims priority under 35 USC 119(e) to U.S. Provisional Application No. 61/646,965, filed May 15, 2012. The entire disclosure of international application PCT/EP2013/059016 and German Application No. 10 2012 208 064.3 are incorporated by reference herein.

The invention relates to an illumination optical unit for EUV projection lithography, for guiding illumination light to an object field in which a lithography mask can be arranged. Additionally, the invention relates to an illumination system with such an illumination optical unit and a projection optical unit for imaging the object field in an image field. Furthermore, the invention relates to a projection exposure apparatus with such an illumination system, a method for producing a microstructured or nanostructured component, in particular a semiconductor chip, with the aid of such a projection exposure apparatus and a microstructured or nanostructured component produced thus.

An illumination optical unit of the type mentioned at the outset is known from US 2011/0001947 A1.

It is an object of the present invention to develop an illumination optical unit of the type mentioned at the outset in such a way that the flexibility is increased when setting different illumination geometries or illumination settings.

According to the invention, this object is achieved by an illumination optical unit for EUV projection lithography, for guiding illumination light to an object field in which a lithography mask can be arranged, having a first facet mirror, which comprises a multiplicity of individual mirrors which can be switched between at least two tilt positions, which individual mirrors provide individual mirror illumination channels for guiding illumination light partial beams to the object field, having a second facet mirror, which is arranged downstream of the first facet mirror in the beam path of the illumination light and has a plurality of facets, which respectively contribute to imaging a group of the individual mirrors of the first facet mirror into the object field via a group mirror illumination channel, wherein the images of the individual mirror groups are superposed on one another in the object field, wherein at least some of the individual mirrors belong to at least two different groups of the individual mirror groups, which, depending on the respective tilt position of the individual mirrors, can respectively be associated with at least one dedicated second facet via at least one dedicated group mirror illumination channel.

The invention is freed from the prescription of a fixed assignment of all individual mirrors of the first facet mirror to specific individual mirror groups, where each individual mirror is only associated with precisely one individual mirror group. In the illumination optical unit according to the invention, tilting the individual mirrors can bring about not only a change between second facets associated via the individual mirror illumination channels, but there can also be a change in the group assignment of the individual mirrors to respectively one individual mirror group which is associated with at least one second facet via at least one group illumination channel. One and the same individual mirror group can, depending on the tilt position of the individual mirrors, be associated with different second facets via respectively one group illumination channel. As a result of the fact that at least some of the individual mirrors can belong to at least two different individual mirror groups, a much larger number of individual mirror groups can be formed in the case of a given number of individual mirrors in the first facet mirror, which individual mirror groups are respectively associated with a dedicated second facet via a dedicated group mirror illumination channel, than was possible in the case of the group assignment according to the prior art. Therefore, a much larger number of second facets can be illuminated via respective group mirror illumination channels using a first facet mirror with a given number of individual mirrors. Accordingly, there is an increase in the number of illumination angular distributions, which, in principle, can be obtained by imaging the individual mirror groups into the illumination field via the facets of the second facet mirror, and thus illumination geometries or illumination settings achievable. Conversely, a given number of required illumination angular distributions can be obtained using a first facet mirror with a smaller number of individual mirrors. The facets of the second facet mirror can, individually or interacting with subsequent components of the illumination optical unit, contribute to imaging the respective individual mirror group of the first facet mirror into the illumination field. A group mirror illumination channel is the totality of all individual mirror illumination channels of an individual mirror group, which complement one another to illuminate the whole illumination field as a result of imaging via the associated facet of the second facet mirror. An individual mirror group can be considered to be an original image of an illumination field, in which the object field is arranged or which coincides with the object field. These original images respectively have substantially the same aspect ratio. The individual mirror groups also respectively have substantially the same aspect ratio. Differences in the aspect ratio, which occur as a result of detailed changes when imaging the respective individual mirror group in the object field as a result of a change in the beam geometry depending on the tilt position of the individual mirrors, remain unconsidered herein. The illumination of the illumination field then constitutes a superposition of the original images in the illumination field, wherein the original images in any case coincide in the object field. Different individual mirror groups are individual mirror groups which are not composed of the same individual mirrors. Thus, in the case of different individual mirror groups, there is always at least one individual mirror which does not simultaneously belong to both individual mirror groups. As already mentioned above, one and the same individual mirror group can, depending on the tilt position, be associated with different second facets. The assignment of the individual mirrors to form the respective individual mirror group and the assignment of the respective individual mirror groups to the respective second facet is brought about by prescribing the corresponding position or switch position of the individual mirrors belonging to the respectively formed individual mirror group.

An assignment in which the majority of the individual mirrors of the first facet mirror belong to at least two of the individual mirror groups, which are respectively associated with a dedicated second facet via a dedicated group mirror illumination channel, leads to particularly great illumination flexibility.

An assignment in which at least some of the individual mirrors of the first facet mirror belong to precisely two of the individual mirror groups, which are respectively associated with a dedicated second facet via a dedicated group mirror illumination channel, avoids that the respective individual mirrors have to assume too many different tilt positions in order to achieve the respective group assignment. A corresponding statement applies to the assignment in which the majority of the individual mirrors of the first facet mirror belong to precisely two of the individual mirror groups, which are respectively associated with a dedicated second facet via a dedicated group mirror illumination channel.

In the assignment, in which none of the individual mirrors of the first facet mirror belong to more than two of the individual mirror groups, which are respectively associated with a dedicated second facet via a dedicated group mirror illumination channel, there is an overlap of at most two of the individual mirror groups, which are respectively associated with a dedicated second facet via a dedicated group mirror illumination channel. This also contributes to keeping the requirements of a tilt adjustment of the individual mirrors moderate.

An overlap, in which two individual mirror groups, which are respectively associated with a dedicated second facet via a dedicated group mirror illumination channel, overlap one another in such a way that between 20% and 80% of all of the individual mirrors of the two individual mirror groups simultaneously belong to both the individual mirror groups, was found to be suitable for practical applications. In particular, the overlap region can comprise whole rows or columns of individual mirrors.

An assignment in which three individual mirror groups, which are respectively associated with a dedicated second facet via a dedicated group mirror illumination channel, overlap one another in such a way that a first group of the three individual mirror groups overlaps a second group of the three individual mirror groups and the second group of the three individual mirror groups overlaps a third group of the three individual mirror groups, wherein the first and the third groups of the three individual mirror groups do not overlap one another, also keeps the requirements to the tiltability of the individual mirrors moderate.

The advantages of an illumination system with an illumination optical unit according to the invention and with a projection optical unit for imaging the object field in an image field, of a projection exposure apparatus
  having an illumination system according to the invention,
  having an EUV light source,
  having an object holder for holding an object in the object field, the object holder being displaceable along a displacement direction via an object displacement drive,
  having a wafer holder for holding a wafer in the image field, the wafer holder being displaceable along the displacement direction via a wafer displacement drive,
of a method for producing a microstructured or nanostructured component, comprising the following method steps:
  providing a wafer, on which a layer of a light-sensitive material is applied at least in part,
  providing a reticle, which has structures to be imaged,
  providing a projection exposure apparatus according to the invention,
  projecting at least part of the reticle onto a region of the layer with the aid of a projection optical unit of the projection exposure apparatus,
and of a component produced by this method correspond to those that were already explained above with reference to the illumination optical unit according to the invention. In the case of a projection exposure apparatus, in which at least two of the individual mirror groups overlap one another along the displacement direction, use can be made of individual mirrors which are substantially designed to be tiltable about one axis. In principle, it is also possible that at least two of the individual mirror groups overlap in a dimension transverse to the displacement direction. A simultaneous overlap of at least two of the individual mirror groups both along and across the displacement direction is also possible.

Figure 2:
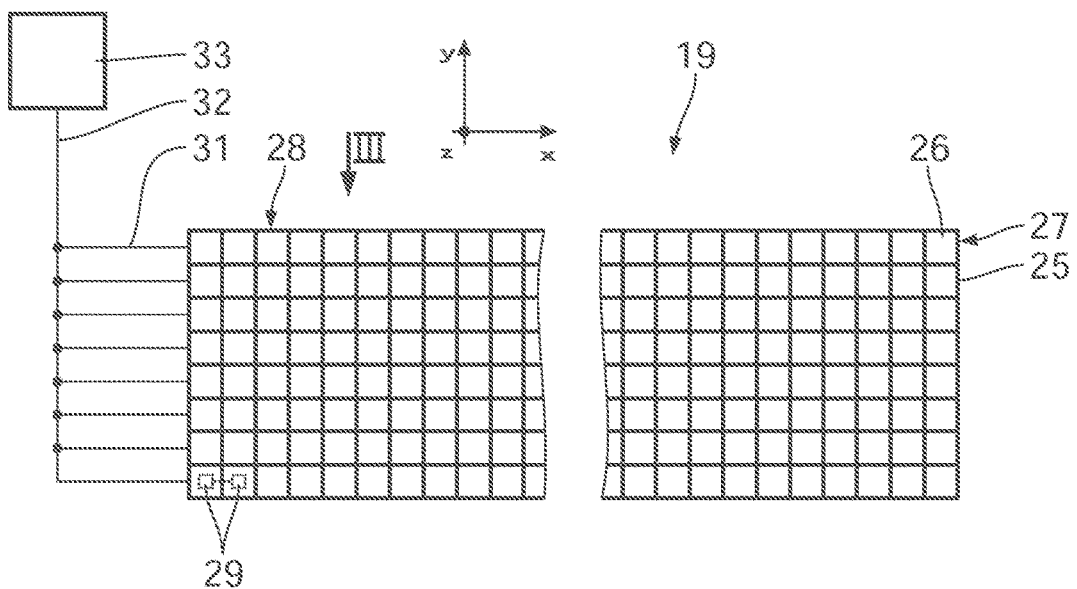
Figure 3:
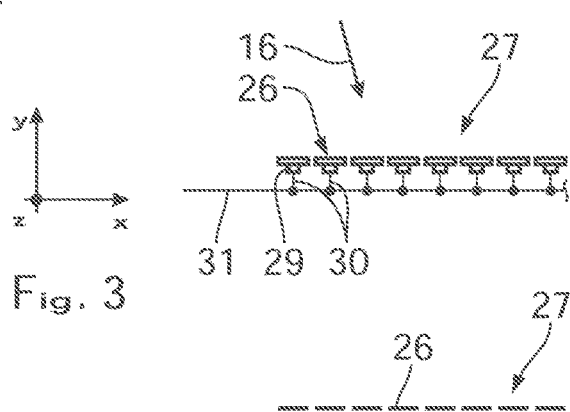
Figure 4:
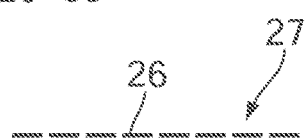
Figure 5:
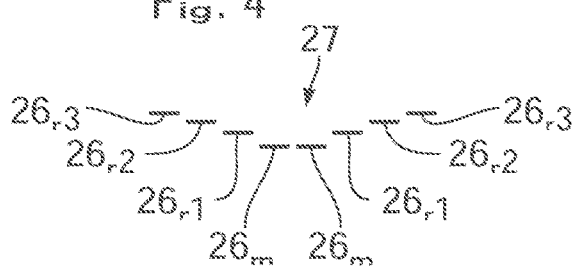
Figure 6:
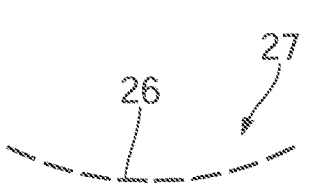
Figure 7:
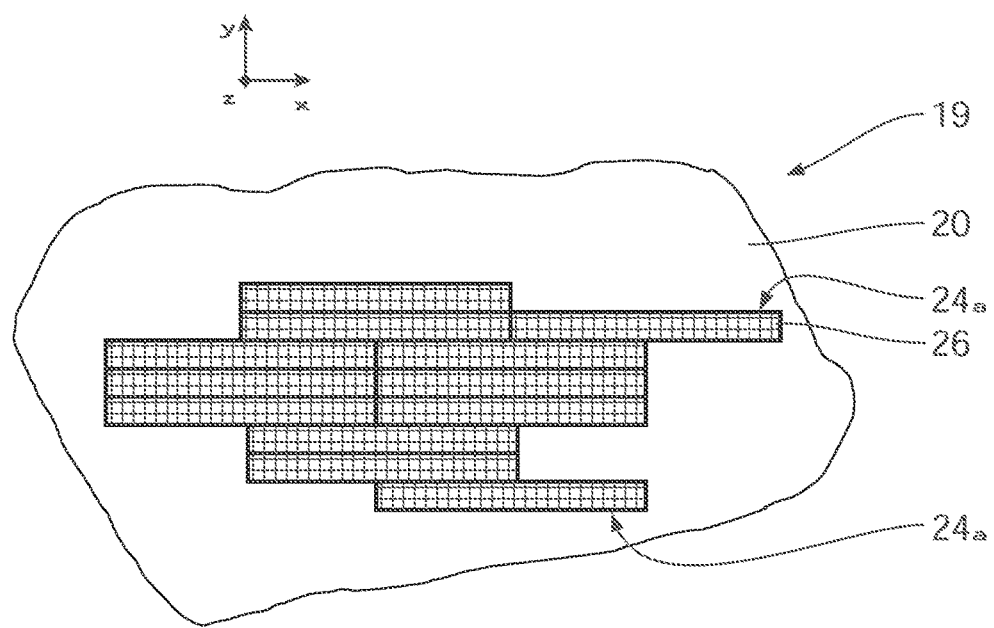
Figure 8:
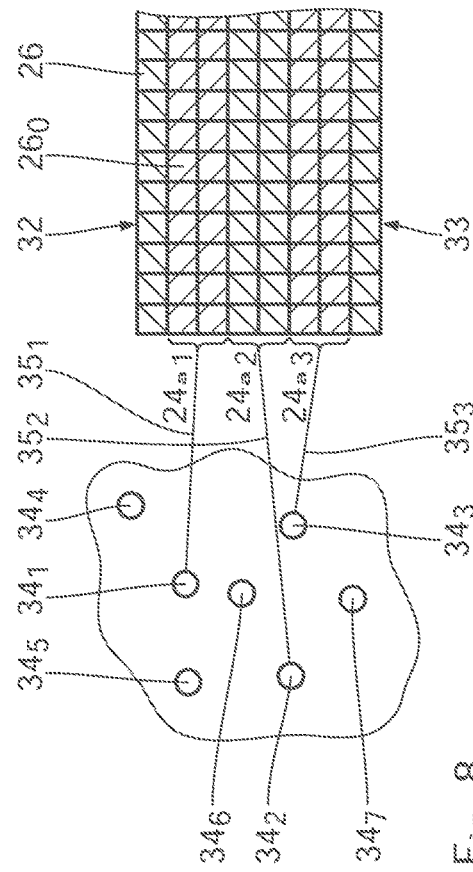
Figure 9:
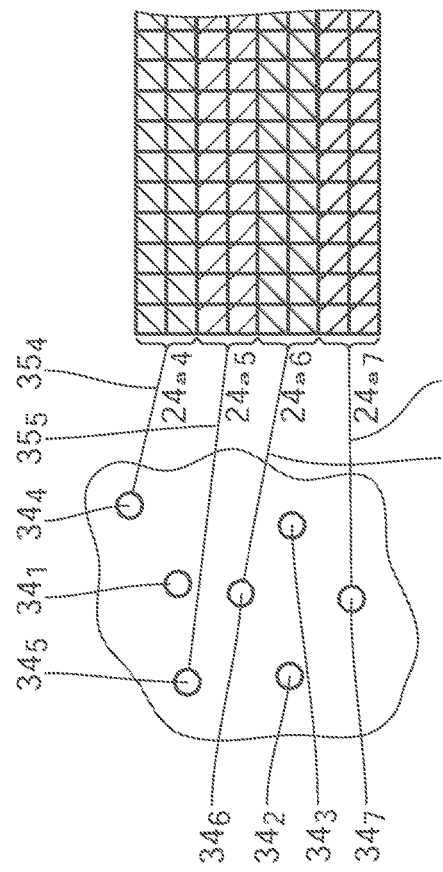
Figure 10:
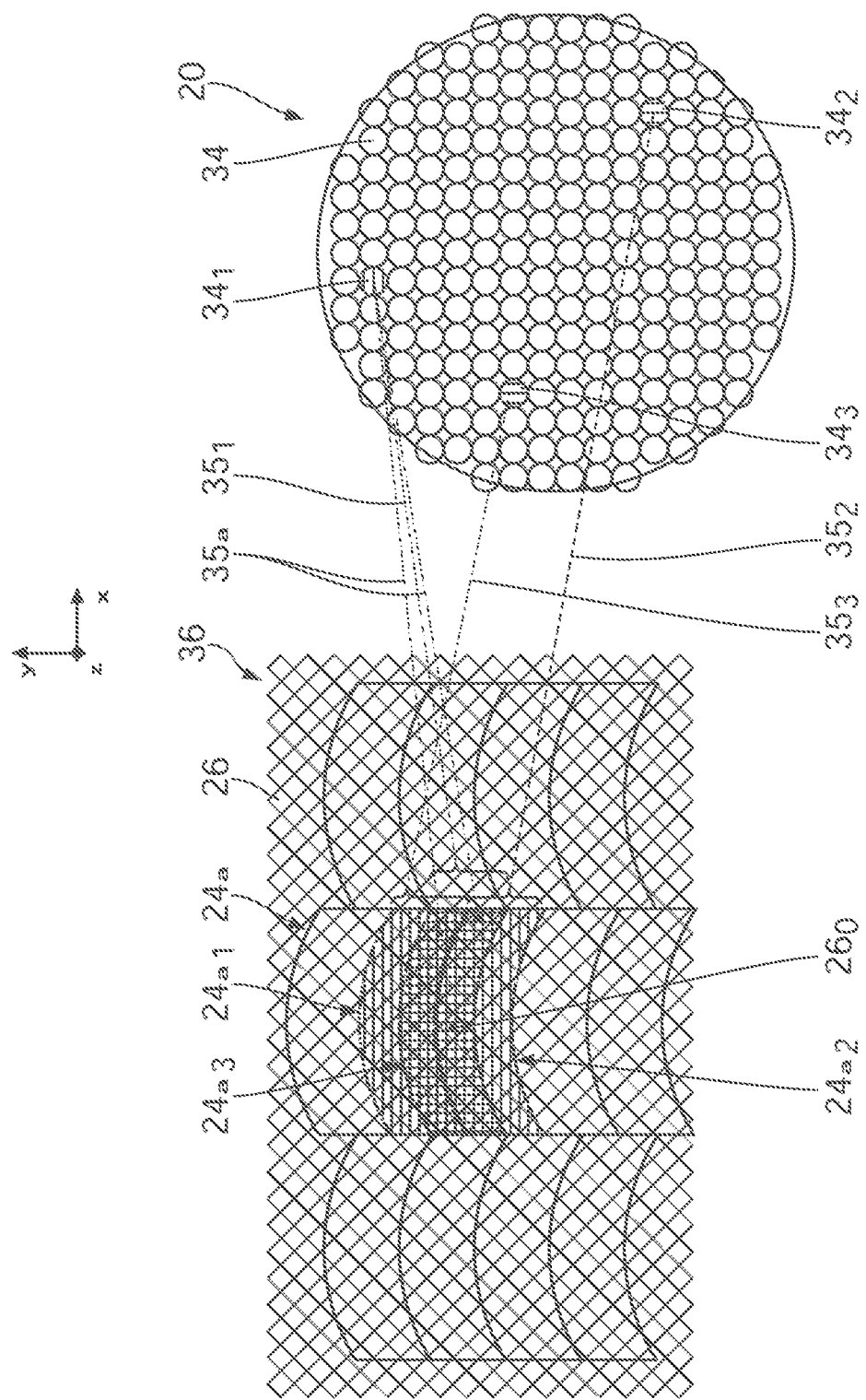

Exemplary embodiments of the invention will be explained in more detail below on the basis of the drawings. In detail:

FIG. 1 schematically shows a meridional section through a projection exposure apparatus for EUV projection lithography;

FIG. 2 schematically shows a top view of a section of a field facet mirror which is made up of individual mirrors and designed for use in the projection exposure apparatus according to FIG. 1;

FIG. 3 shows a view of a section of an individual mirror row of the facet mirror according to FIG. 2 from the viewing direction III in FIG. 2;

FIGS. 4 to 6 very schematically show, in three different configurations, different forms of a row reflection surface formed from the individual mirrors of the individual mirror row illustrated in FIG. 3;

FIG. 7 shows a top view of a section of an embodiment of a field facet mirror, made up of individual mirrors, with an exemplary grouping of the individual mirrors in an arrangement of individual mirror groups;

FIGS. 8 and 9 show examples of various groupings of the individual mirrors of the facet mirror according to FIG. 2 in individual mirror groups with such a grouping assignment that some of the individual mirrors belong to at least two different individual mirror groups, which are respectively associated with a dedicated second facet of a second facet mirror, likewise illustrated in FIGS. 8 and 9 in top view, respectively on the left-hand side, via a dedicated group mirror illumination channel;

FIG. 10 very schematically shows a top view of a section of a further embodiment of a field facet mirror, made up of individual mirrors, with such a grouping assignment of the individual mirrors that some of the individual mirrors belong to at least two different individual mirror groups, which are respectively associated with a dedicated second facet of a second facet mirror, likewise illustrated in FIG. 10 in top view, on the right-hand side, via a dedicated group mirror illumination channel.

In a meridional section, FIG. 1 schematically shows a projection exposure apparatus 1 for microlithography. The projection exposure apparatus 1 includes a radiation source 2. An illumination system 3 of the projection exposure apparatus 1 has an illumination optical unit 4 for exposing an illumination field, which coincides with an object field 5, in an object plane 6. The illumination field can also be larger than the object field 5. What is exposed here is an object in the form of a reticle 7, which is arranged in the object field 5 and held by an object or reticle holder 8. The object holder 8 can be displaced along a displacement direction via an object displacement drive 9. A projection optical unit 10 serves for imaging the object field 5 in an image field 11 in an image plane 12. A structure on the reticle 7 is imaged on a light-sensitive layer of a wafer 13 arranged in the region of the image field 11 in the image plane 12. The wafer 13 is held by a wafer holder 14 (likewise not illustrated). The wafer holder 14 can likewise be displaced, synchronized with the object holder 8, along the displacement direction via a wafer displacement drive 15.

The radiation source 2 is an EUV radiation source with an emitted used radiation in the range between 5 nm and 30 nm. Here, this can be a plasma source, for example a GDPP source (gas discharge-produced plasma) or an LPP source (laser-produced plasma). A radiation source which is based on a synchrotron or on a free electron laser (FEL) can also be used as radiation source 2. By way of example, a person skilled in the art finds information in respect of such a radiation source in U.S. Pat. No. 6,859,515 B2. EUV radiation 16, which is emitted by the radiation source 2, is focused by a collector 17. A corresponding collector is known from EP 1 225 481 A. After the collector 17, the EUV radiation 16 propagates through an intermediate focus plane 18, before it is incident on a field facet mirror 19. The field facet mirror 19 is a first facet mirror of the illumination optical unit 4. The field facet mirror 19 has a multiplicity of individual mirrors, which are not illustrated in FIG. 1. The field facet mirror 19 is arranged in a plane of the illumination optical unit 4, which is optically conjugate to the object plane 6.

In the following text, the EUV radiation 16 is also referred to as illumination light or imaging light.

After the field facet mirror 19, the EUV radiation 16 is reflected by a pupil facet mirror 20. The pupil facet mirror 20 is a second facet mirror of the illumination optical unit 4. The pupil facet mirror 20 is arranged in a pupil plane of the illumination optical unit 4, which is optically conjugate to the intermediate focus plane 18 and to a pupil plane of the projection optical unit 10, or coincides with this pupil plane. The pupil facet mirror 20 has a plurality of pupil facets, which are not illustrated in FIG. 1. With the aid of the pupil facets of the pupil facet mirror 20 and a subsequent imaging optical assembly in the form of a transmission optical unit 21 with mirrors 22, 23 and 24, denoted in the sequence of the beam path, individual mirror groups 24a (see FIG. 7), which will still be described in more detail below, of the field facet mirror 19 are imaged into the object field 5. The last mirror 24 of the transmission optical unit 21 is a grazing-incidence mirror.

In order to simplify the description of positional relations, a Cartesian xyz-coordinate system is plotted in FIG. 1 as a global coordinate system for the description of the positional relations of components of the projection exposure apparatus 1 between the object plane 6 and the image plane 12. In FIG. 1, the x-axis extends perpendicular to the plane of the drawing and into the latter. The y-axis extends toward the right in FIG. 1 and parallel to the displacement direction of the object holder 8 and of the wafer holder 14. In FIG. 1, the z-axis extends downward, i.e. perpendicular to the object plane 6 and to the image plane 12.

FIG. 2 shows details of the design of the field facet mirror 19 in a very schematic illustration. An overall reflection surface 25 of the field facet mirror 19 is subdivided into rows and columns to form a grid of individual mirrors 26. The individual reflection surfaces of the individual individual mirrors 26 are planar and have no curvature. An individual mirror row 27 has a plurality of individual mirrors 26 lying directly next to one another. Several ten to several hundred individual mirrors 26 can be provided on one individual mirror row 27. In the example according to FIG. 2, the individual mirrors 26 are square. Other shapes of individual mirrors, which allow occupancy of the reflection surface 20 with as few gaps as possible, can also be used. Such alternative individual mirror shapes are known from the mathematical theory of tessellation. In this context, reference is made to the references specified in WO 2009/100 856 A1.

Depending on the embodiment of the field facet mirror 19, an individual mirror column 28 likewise has a plurality of individual mirrors 26. By way of example, several ten to several hundred individual mirrors 26 are provided per individual mirror column 28.

In order to simplify the description of positional relations, a Cartesian xyz-coordinate system is plotted in FIG. 2 as a local coordinate system of the field facet mirror 19. Corresponding local xyz-coordinate systems are also found in the following figures which show facet mirrors or a section thereof in a top view. In FIG. 2, the x-axis extends horizontally to the right, parallel to the individual mirror rows 27. In FIG. 2, the y-axis extends upward, parallel to the individual mirror columns 28. The z-axis is perpendicular to the plane of the drawings of FIG. 2 and extends out of the latter.

The y-direction of the global coordinate system according to FIG. 1, i.e. the displacement direction for the reticle 7 and the wafer 13, and the y-direction of the local coordinate system according to FIG. 2, i.e. the column direction of the individual mirror array, need not extend precisely parallel to one another, but can rather assume e.g. a small angle with respect to one another.

In the x-direction, the reflection surface 25 of the field facet mirror 19 has an extent of $x_0$. In the y-direction, the reflection surface 25 of the field facet mirror 19 has an extent of $y_0$.

Depending on the embodiment of the field facet mirror 19, the individual mirrors 26 have x/y extents in the region of, for example, 500 µm×500 µm to, for example, 2 mm×2 mm. The individual mirrors 26 can be shaped in such a way that they have a focusing effect for the illumination light 16. Such a focusing effect of the individual mirrors 26 is particularly advantageous if use is made of a divergent illumination of the field facet mirror 19 by the illumination light 16. The overall field facet mirror 19 has an $x_0/y_0$ extent which, depending on the embodiment, for example is 300 mm×300 mm or 600 mm×600 mm. The individual mirror groups 24a (see FIG. 7) have typical x/y extents of 25 mm×4 mm or of 104 mm×8 mm. Depending on the ratio between the size of the respective individual mirror groups 24a and the size of the individual mirrors 26, which make up these individual mirror groups 24a, each of the individual mirror groups 24a has an appropriate number of individual mirrors 26.

For the purposes of an individual deflection of incident illumination light 16, each of the individual mirrors 26 is respectively connected to an actuator 29, as indicated in a dashed fashion in FIG. 2 on the basis of two individual mirrors 26 arranged in a bottom left-hand corner of the reflection surface 25 and illustrated in more detail in FIG. 3 on the basis of a section of an individual mirror row 27. The actuators 29 are arranged on the side of each of the individual mirrors 26 which faces away from a reflecting side of the individual mirrors 26. By way of example, the actuators 29 can be configured as piezoactuators. Embodiments of such actuators are known from the design of micro-mirror arrays.

The actuators 29 of an individual mirror row 27 are respectively connected to a row signal bus 31 via signal lines 30. One individual mirror row 27 is associated with respectively one of the row signal buses 31. The row signal buses 31 of the individual mirror rows 27 are in turn connected to a main signal bus 32. The latter has a signal connection to a control device 33 of the field facet mirror 19. The control device 33 is in particular configured for common line-by-line, i.e. row-by-row or column-by-column, actuation of the individual mirrors 26. An individual actuation of the individual mirrors 26 is also possible within the individual mirror rows 27 and the individual mirror columns 28.

Each of the individual mirrors 26 can, individually and independently, be tilted about two tilt axes which are perpendicular to one another, wherein a first one of these tilt axes extends parallel to the x-axis and the second one of these two tilt axes extends parallel to the y-axis. The two tilt axes lie in the individual reflection surfaces of the respective individual mirrors 26.

Additionally, the actuators 29 also render it possible to displace the individual mirrors 26 individually in the z-direction. Thus, the individual mirrors 26 can be displaced in an actuatable manner separately from one another along a normal to the reflection surface 25. As a result, it is possible to change the topography of the reflection surface 25 overall. This is illustrated in an exemplary and very schematic fashion on the basis of FIGS. 4 to 6. As a result, it is also possible to manufacture contours of the reflection surface with large sagittal heights, i.e. large variations in the topography of the reflection surface, in the form of mirror sections, arranged in a plane overall, in the style of Fresnel lenses. A basic curvature of such a mirror surface topography with large sagittal height is eliminated by such a subdivision into sections in the style of Fresnel zones.

FIG. 4 shows individual reflection surfaces of the individual mirrors 26 of a section of an individual mirror row 27, wherein all individual mirrors 26 of this individual mirror row 27 are set to the same absolute z-position by the control device 33 and the actuators 29. This results in a planar row reflection surface of the individual mirror row 27. If all individual mirrors 26 of the field facet mirror 19 are aligned in accordance with FIG. 4, the whole reflection surface 25 of the field facet mirror 19 is planar.

FIG. 5 shows an actuation of the individual mirrors 26 of the individual mirror row 27, in which the central individual mirror $26_m$ is set offset in the negative z-direction with respect to neighboring individual mirrors $26_{r1}$, $26_{r2}$, $26_{r3}$. The result of this is a stepped arrangement, which leads to a corresponding phase offset of the EUV radiation 16 incident on the individual mirror row 27 according to FIG. 5. The EUV radiation 16 reflected by the two central individual mirrors $26_m$ experiences the greatest phase retardation here. The edge-side individual mirrors $26_{r3}$ generate the least phase retardation. The intermediate individual mirrors $26_{r1}$, $26_{r2}$ generate, correspondingly step-wise, increasingly less phase retardation proceeding from the phase retardation by the central individual mirrors $26_m$.

FIG. 6 shows an actuation of the individual mirrors 26 of the illustrated section of the individual mirror row 27 in such a way that this results overall in a convexly shaped individual mirror row 27 as a result of, firstly, the offset of the individual mirrors 26 with respect to one another in the z-direction and, secondly, the orientation of the individual mirrors 26 with respect to one another. This can be used to generate an imaging effect of individual mirror groups of the field facet mirror 19. In the same way, an e.g. concave arrangement of groups of the individual mirrors 26 is also possible of course.

Corresponding designs, as explained above with reference to FIGS. 5 and 6, are not restricted to the x-dimension, but can, depending on the actuation via the control device 33, also be continued over the y-dimension of the field facet mirror 19.

As a result of individual actuation of the actuators 29 via the control device 33, it is possible to set a predetermined tilt grouping of the individual mirrors 26 to form the individual mirror groups 24a, already mentioned above, made of respectively at least two individual mirrors 26. The individual mirror groups 24a are respectively associated with at least one dedicated pupil facet of the pupil facet mirror 20 for imaging the individual mirror group 24a into the object field 5 via at least one dedicated group mirror illumination channel for the illumination light 16. This assignment is brought about by predetermining the respective tilt position or switch position of the individual mirrors belonging to the individual mirror group 24a. Here, the group mirror illumination channel is the totality of all individual mirror illumination channels of the respective individual mirror group 24a, which complement one another as a result of the imaging via the pupil facet to illuminate the whole illumination or object field 5. Each of the individual mirror groups 24a can therefore be considered to be an original image of the illumination field 5. The overall illumination of the illumination or object field 5 then constitutes the superposition of these original images.

Therefore, the function of a facet of a field facet mirror is assumed in each case by one of the individual mirror groups 24a, as is disclosed for example in U.S. Pat. No. 6,438,199 B1 or in U.S. Pat. No. 6,658,084 B2.

FIG. 7 exemplifies such a grouping. A section of the reflection surface 25 of a field facet plate of a variant of the field facet mirror 19 with, compared to the illustration according to FIG. 2, a larger number of individual mirrors 26 is illustrated. Components corresponding to those which have already been explained above with reference to FIGS. 2 to 6 are denoted by the same reference signs and will not be discussed again in detail.

In the example of FIG. 7, a total of twelve individual mirror groups 24a are formed within the reflection surface 25 by appropriate combination of the actuations by the control device 33. The individual mirror groups 24a respectively have the same x/y aspect ratio. Each of the individual mirror groups 24a consists of a 24×3 array of individual mirrors 26, i.e. has three individual mirror rows with respectively twenty-four individual mirrors 26. Thus, each of the individual mirror groups 24a has an aspect ratio of 8 to 1. This aspect ratio corresponds to the aspect ratio of the object field 5 to be illuminated.

Within each of the individual mirror groups 24a, the individual mirrors 26 are aligned with respect to one another in such a way that the shape of each of the individual mirror groups 24a corresponds to the shape of an individual field facet of a conventional field facet mirror.

FIGS. 8 and 9 show examples of groupings of the individual mirrors 26 of the field facet mirror 19 to form individual mirror groups 24a. Here, the individual mirror rows 27 are provided with an index, numbered continuously from top to bottom. Thus, the uppermost individual mirror line is denoted by $27_1$ and the lowest individual mirror line is denoted by $27_8$.

In the grouping according to FIG. 8, respectively two individual mirror rows lying one above the other, namely the individual mirror rows $27_{2/3}$, $27_{4/5}$ and $27_{6/7}$, are combined to form three individual mirror groups $24a_1$, $24a_2$ and $24a_3$. The assignment of these individual mirror groups $24a_1$ to $24a_3$ with three pupil facets $34_1$, $34_2$ and $34_3$ via group mirror illumination channels $35_1$, $35_2$ and $35_3$ is also illustrated schematically in FIG. 8. In the assignment according to FIG. 8, the illumination light is guided, via the pupil facets $34_1$ to $34_3$, via the individual mirror illumination channels of the individual mirrors 26 belonging to these individual mirror groups $24a_1$ to $24a_3$, to the illumination field 5, wherein the respective individual mirror group $24a_1$ to $24a_3$ is imaged in the object or illumination field 5. The individual mirrors 26 of the individual mirror groups $24a_1$ to $24a_3$ are tilted via the control device 33 in such a way that the illumination light 16 is guided to the respective pupil facets $34_1$ to $34_3$.

FIG. 9 shows a different assignment of the individual mirrors 26 of the field facet mirror 19 to form individual mirror groups. Here, the individual mirror rows $27_{1/2}$ are associated with the individual mirror group $24a_4$, the individual mirror rows $27_{3/4}$ are associated with the individual mirror group $24a_5$, the individual mirror rows $27_{5/6}$ are associated with the individual mirror group $24a_6$ and the individual mirror rows $27_{7/8}$ are associated with the individual mirror group $24a_7$. The individual mirror groups $24a_4$ to $24a_7$ are associated with further pupil facets $34_4$ to $34_7$, which are different from the pupil facets $34_1$ to $34_3$ from the assignment according to FIG. 8, via group mirror illumination channels $35_4$ to $35_7$. The individual mirror groups $24a_4$ to $24a_7$ are once again imaged in the object or illumination field 5 via the group mirror illumination channels $35_4$ to $35_7$ and the pupil facets $34_4$ to $34_7$.

In the assignment according to FIG. 9, the pupil facets $34_1$ to $34_3$ remain unilluminated. Correspondingly, in the assignment according to FIG. 8, the pupil facets $34_4$ to $34_7$ remain unilluminated.

The two different assignments of the individual mirror groups 24a to the pupil facets 34 result in correspondingly different illumination angular distributions in the illumination of the object or illumination field 5. These different illumination angular distributions are also referred to as illumination settings.

The individual mirrors 26 of the individual mirror rows $27_2$ to $27_7$ belong to two different individual mirror groups 24a in the assignment examples of FIGS. 8 and 9. By way of example, the individual mirror row $27_2$ belongs firstly to the individual mirror group $24a_1$ and secondly to the individual mirror group $24a_4$. These different individual mirror groups, i.e., for example, the individual mirror groups $24a_1$, $24a_4$, are respectively associated with a dedicated second facet, i.e. the pupil facets $34_1$ and $34_4$ in the illustrated example, via a dedicated group mirror illumination channel, i.e., for example, via the group mirror illumination channels $35_1$ and $35_4$.

In the embodiment according to FIGS. 8 and 9, the majority of the individual mirrors 26 of the field facet mirror 19, namely the individual mirrors of the individual mirror rows $27_2$ to $27_7$, belong to at least two individual mirror groups 24a, which are respectively associated with a dedicated second facet 34 via a dedicated group mirror illumination channel 35. These individual mirrors of the individual mirror rows $27_2$ to $27_7$ respectively belong to precisely two individual mirror groups 24a as already explained above. It is self-evident that illumination geometries are also possible, in which certain individual mirrors 26 belong to a larger number of individual mirror groups 24a. By way of example, if an individual mirror group 24a is made up of three individual mirror rows 27, it is possible, analogously to what was already explained above in conjunction with FIGS. 8 and 9, to predetermine grouping assignments, in which one of these three individual mirror rows constitutes an upper individual mirror row of a first individual mirror group in a first grouping, a central row of a second individual mirror group in a second grouping and a lower row of a third individual mirror group in a third grouping.

In the embodiment according to FIGS. 8 and 9, none of the individual mirrors 26 belongs to more than two individual mirror groups 24a. In the alternative grouping assignments according to FIGS. 8 and 9, the individual mirror groups 24a, i.e., for example, the individual mirror groups $24a_1$ of the grouping assignment according to FIG. 8 and the individual mirror group $24a_4$ of the grouping assignment according to FIG. 9, overlap in such a way that 50% of all of the individual mirrors 26 of these individual mirror groups $24a_1$, $24a_4$, namely the individual mirrors 26 of the individual mirror row $27_2$, simultaneously belong to both individual mirror groups $24a_1$, $24a_4$. In the embodiment according to FIGS. 8 and 9, there exist respectively three individual mirror groups, namely, for example, the individual mirror groups $24a_4$, $24a_5$ of the grouping assignment according to FIG. 9 and the individual mirror group $24a_1$ of the grouping assignment according to FIG. 8, which overlap one another in such a way that the individual mirror groups $24a_4$ and $24a_5$ each overlap with the individual mirror group $24a_1$, but do not overlap one another.

An alternative embodiment of a grouping assignment when using a variant of a field facet mirror 36 is illustrated in FIG. 10. Components corresponding to those which have already been explained above with reference to FIGS. 1 to 9 are denoted by the same reference signs and will not be discussed again in detail.

Similar to the field facet mirror 19, the field facet mirror 36 is subdivided into a grid of individual mirrors 26. However, in the field facet mirror 36, the rows and columns of this grid respectively extend at an angle of 45° to the object displacement direction y. A further difference between the field facet mirror 36 according to FIG. 10 and the field facet mirror 19 is that the individual mirror groups 24a are not enclosed in a rectangular but in an arcuate fashion. These arcuate individual mirror groups 24a are correspondingly imaged into an arcuate object or illumination field via respectively associated pupil facets 34 and, optionally, a downstream transmission optical unit, as is known, in principle, from the prior art.

The arcuate edge of the individual mirror groups 24a is respectively illustrated in FIG. 10 with a full line. Those individual mirrors 26 of which more than 50% respectively lie within this edge belong to the respective individual mirror group 24a.

Two different grouping assignments of individual mirror groups 24a to pupil facets 34 are illustrated in FIG. 10. In a first grouping assignment, the individual mirrors 26 of two individual mirror groups $24a_1$, $24a_2$, which lie above one another and adjoin one another, are associated with two pupil facets $34_1$, $34_2$ via group mirror illumination channels $35_1$, $35_2$. In an alternative grouping assignment, a third individual mirror group $24a_3$, which in half overlaps these two first individual mirror groups $24a_1$, $24a_2$, is associated with a third pupil facet $34_3$ via a third group mirror illumination channel $35_3$.

In FIG. 10, one of the individual mirrors $26_0$ is highlighted in an exemplary fashion, the individual mirror belonging to the two different individual mirror groups $24a_2$ and $24a_3$. This individual mirror $26_0$ belongs to precisely two individual mirror groups, namely to individual mirror groups $24a_2$ and $24a_3$.

Some of the individual mirror illumination channels 35a are also illustrated in an exemplary fashion in FIG. 10. Illumination light partial beams of the illumination light 16 are guided from the respective individual mirror 26 via the individual mirror illumination channels 35a, via the respective pupil facet 34 to the illumination or object field 5.

In the embodiment according to FIG. 10, the two individual mirror groups $24a_1$ and $24a_3$ for example also overlap one another in such a way that approximately 50% of all of the individual mirrors 26 of the two individual mirror groups $24a_1$, $24a_3$ simultaneously belong to both individual mirror groups $24a_1$, $24a_3$. The two individual mirror groups $24a_1$ and $24a_3$ on the one hand and the two individual mirror groups $24a_2$ and $24a_3$ on the other hand respectively overlap by approximately 50%, whereas the two individual mirror groups $24a_1$ and $24a_3$ do not overlap one another.

In the field facet mirrors 19 and 36, the individual mirrors 26 can be grouped to form individual mirror groups $24a$ in many different ways, such that the pupil facet mirror 20 can have a much larger number of pupil facets 34 on which illumination light 16 can impinge via the associated group mirror illumination channels 35 via the alternative assignments of the individual mirrors 26 to form individual mirror groups $24a$. The selection of different illumination settings is markedly increased hereby.

With the aid of the projection exposure apparatus 1, at least part of the reticle in the object field 5 is imaged onto a region of a light-sensitive layer onto the wafer 13 in the image field 11 for the lithographic production of a microstructured or nanostructured component, in particular of a semiconductor component, for example a microchip. Depending on whether the projection exposure apparatus 1 is embodied as a scanner or as a stepper, the reticle 7 and the wafer 13 are displaced in the y-direction in a temporally synchronized fashion, either continuously in the scanner operation or in a step-by-step fashion in the stepper operation.

The invention claimed is:

1. An illumination optical unit configured to guide illumination light to an object field, the illumination optical unit comprising:
    a first facet mirror comprising a multiplicity of individual mirrors which are switchable between at least two tilt positions, the individual mirrors configured to provide individual mirror illumination channels to guide illumination light partial beams to the object field; and
    a second facet mirror downstream of the first facet mirror in a beam path of the illumination light through the illumination optical unit, the second facet mirror comprising a plurality of facets configured to respectively contribute to imaging a group of the individual mirrors of the first facet mirror into the object field via a group mirror illumination channel so that images of the individual mirror groups are superposed on each other in the object field,
    wherein:
        for at least some of the individual mirrors of the first mirror:
            in a first tilt position of the individual mirror, the individual mirror belongs to a first individual mirror group which has a first dedicated facet of the second facet mirror;
            in a second tilt position of the individual mirror, the individual mirror belongs to a second individual mirror group which has a second dedicated facet of the second facet mirror;
            the first tilt position is different from the second tilt position;
            the first individual mirror group is different from the second individual mirror group; and
            the first dedicated facet of the second facet mirror is different from the second dedicated facet of the second facet mirror;
        three individual mirror groups which are respectively associated with a dedicated second facet via a dedicated group mirror illumination channel overlap each other so that a first group of the three individual mirror groups overlaps a second group of the three individual mirror groups and so that the second group of the three individual mirror groups overlaps a third group of the three individual mirror groups;
        the first and third groups of the three individual mirror groups do not overlap each other: and
        the illumination optical unit is an EUV lithography illumination optical unit.

2. The illumination optical unit of claim 1, wherein a majority of the individual mirrors of the first facet mirror belongs to at least two of the individual mirror groups which are respectively associated with a dedicated second facet via a dedicated group mirror illumination channel.

3. The illumination optical unit of claim 2, wherein each individual mirror group comprises a plurality of individual mirrors which are arranged in an array with a plurality of rows and a plurality of columns.

4. The illumination optical unit of claim 1, wherein at least some of the individual mirrors of the first facet mirror belong to precisely two of the individual mirror groups which are respectively associated with a dedicated second facet via a dedicated group mirror illumination channel.

5. The illumination optical unit of claim 4, wherein each individual mirror group comprises a plurality of individual mirrors which are arranged in an array with a plurality of rows and a plurality of columns.

6. The illumination optical unit of claim 1, wherein a majority of the individual mirrors of the first facet mirror belong to precisely two of the individual mirror groups which are respectively associated with a dedicated second facet via a dedicated group mirror illumination channel.

7. The illumination optical unit of claim 6, wherein each individual mirror group comprises a plurality of individual mirrors which are arranged in an array with a plurality of rows and a plurality of columns.

8. The illumination optical unit of claim 1, wherein none of the individual mirrors of the first facet mirror belong to more than two of the individual mirror groups which are respectively associated with a dedicated second facet via a dedicated group mirror illumination channel.

9. The illumination optical unit of claim 8, wherein each individual mirror group comprises a plurality of individual mirrors which are arranged in an array with a plurality of rows and a plurality of columns.

10. The illumination optical unit of claim 1, wherein two individual mirror groups which are respectively associated with a dedicated second facet via a dedicated group mirror illumination channel overlap each other so that between 20% and 80% of all of the individual mirrors of the two individual mirror groups simultaneously belong to both individual mirror groups.

11. The illumination optical unit of claim 10, wherein each individual mirror group comprises a plurality of individual mirrors which are arranged in an array with a plurality of rows and a plurality of columns.

12. A system, comprising:
    an illumination optical unit according to claim 1; and
    a projection optical unit configured to image the object field into an image field.

13. An apparatus, comprising:
    an EUV light source;
    an illumination optical unit according to claim 1; and a projection optical unit configured to image the object field into an image field.

14. The apparatus of claim 13, further comprising an object holder and a wafer holder, wherein the object holder is configured to hold an object in the object field, the object holder is configured to displace the object along a displacement direction, and the wafer holder is displaceable along the displacement direction.

15. The apparatus of claim 14, further comprising an object displacement drive and wafer displacement drive, wherein the object displacement drive is configured to displace the object in the displacement direction, and the wafer displacement drive is configured to displace the wafer in the displacement direction.

16. The apparatus of claim 14, wherein at least two of the individual mirror groups overlap each other along the displacement direction.

17. A method of operating an apparatus comprising an illumination optical unit and a projection optical unit, the method comprising:
  using the illumination optical unit to illuminate at least some structures of a reticle; and
  using the projection optical unit to project at least some of the illuminated structures of the reticle onto a light-sensitive material,
  wherein the illumination optical unit is an illumination optical unit according to claim 1.

18. The illumination optical unit of claim 1, wherein each individual mirror group comprises a plurality of individual mirrors which are arranged in an array with a plurality of rows and a plurality of columns.

* * * * *